United States Patent [19]
Shimomura et al.

[11] Patent Number: 5,800,612
[45] Date of Patent: Sep. 1, 1998

[54] SINGLE-CRYSTAL SEMICONDUCTOR PULLING APPARATUS

[75] Inventors: Koichi Shimomura; Yoshinobu Hiraishi; Taizou Miyamoto, all of Omura, Japan

[73] Assignee: Komatsu Electronic Metals Co., Ltd., Hiratsuka, Japan

[21] Appl. No.: 796,365

[22] Filed: Feb. 6, 1997

[30]  Foreign Application Priority Data

Feb. 8, 1996  [JP]  Japan .................................. 8-059915

[51] Int. Cl.$^6$ .................................................. C30B 35/00
[52] U.S. Cl. .............................................. 117/201; 117/202
[58] Field of Search .............................. 117/14, 15, 200, 117/201, 202

[56]  References Cited

U.S. PATENT DOCUMENTS

| | | | |
|---|---|---|---|
| 3,822,111 | 7/1974 | Suzuki et al. | 117/202 |
| 3,998,598 | 12/1976 | Bonora | 117/202 |
| 4,511,428 | 4/1985 | Ghosh et al. | 117/916 |
| 4,794,263 | 12/1988 | Katsuoka et al. | 117/201 |
| 4,876,438 | 10/1989 | Watanabe et al. | 117/202 |
| 5,223,078 | 6/1993 | Maeda et al. | 117/202 |
| 5,408,952 | 4/1995 | Wakabayashi et al. | 117/201 |
| 5,578,284 | 11/1996 | Chandrasekhar et al. | 117/201 |

*Primary Examiner*—Felisa Garrett
*Attorney, Agent, or Firm*—Varndell Legal Group

[57]  ABSTRACT

A single-crystal semiconductor pulling apparatus improves the crystallization rate by reinforcing the physical strength of the Dash's neck portion, and eliminate the process time difference depending on the experiences of operators. The single-crystal semiconductor pulling apparatus, which is according to the Czochralski method, includes controller for automatically controlling the pulling rate of a seed crystal and a melt temperature. The controller modifies a target value of a diameter of a crystal grown from the seed which is immersed from a first value to a second value. The first value is for ensuring dislocation-free state, while the second value is for retaining physical strength of the crystal. Furthermore, the controller is provided with the function of judging the crystal to be in dislocation-free state. That is, the controller measures a length of each portion of the crystal whose diameter is smaller than the first value, and accumulates the length, and judges the crystal to be in dislocation-free state when the accumulate value is a value determined according to a reference length.

8 Claims, 3 Drawing Sheets

The judgement of being in dislocation-free state $$NLR = \frac{a+b+c+d}{L}$$

SINGLE-CRYSTAL SEMICONDUCTOR PULLING APPARATUS

BACKGROUND OF THE INVENTION

1. Field of the Invention

The present invention relates to a single-crystal semiconductor pulling apparatus in which the Czochralski method is utilized to fabricate a single-crystal semiconductor. When a single-crystal semiconductor without dislocation is willing to grow from a seed rod by means of the apparatus of the invention, a Dash's neck portion is formed to include a diameter-reduced portion succeeded with a thicker portion. Therefore the single-crystal semiconductor can be automatically judged to be in dislocation-free state and physical strength of the Dash's neck portion is reinforced.

2. Description of Related Art

A conventional single-crystal semiconductor pulling apparatus employing the Czochralski method pulls a seed which is immersed in a melt and is pulled at a pulling rate of 1.0 –5.0 mm/min. The diameter of the pulled single-crystal rod is automatically controlled within a range of between 2 and 6 mm$\phi$. The formation of a Dash's neck portion and ensuring of dislocation-free state are then controlled by the operator of the apparatus, according to the variation of the diameter, the pulling rate, and the surface shape, based on the operator's experiences. Thereafter, a crown step of expanding the diameter of the single-crystal rod to a predetermined value is successively carried out. For example, Japanese Patent Laid Open No. 58-194797 discloses a method in which the crystal is automatically judged to be in dislocation-free state by light-detecting the meniscus region around the solid-melt interface. Japanese Patent Laid Open No. 5-270968 discloses a single-crystal semiconductor whose neck portion is covered with a hard liquid material for reinforcing the physical strength. Japanese Patent Laid Open No. 6-92783 discloses a method in which a camera is utilized to observe the solid-liquid interface, and a monitor is utilized to analyze camera signals which are taken from horizontal scan lines across the meniscus ring of the growing a single-crystal semiconductor, thereby judging to appear the dislocation.

In the conventional methods, however, one operator has to take over several apparatus so that prediction of formation of the neck portion and ensuring of dislocation-free state tend to delayed. Moreover, because the conventional methods depend largely on the experiences of the operator, a less-experienced operator may form an unnecessarily long neck portion due to the delay in the examination. Therefore in the conventional methods, the pulling time becomes longer and productivity is lowered. When the method of Japanese Patent Laid Open No. 58-194797 is utilized, the dislocation will be difficult to be examined through the amplitude of the meniscus ring (bright ring) because of large variation in the diameter of the neck portion. Furthermore, since the diameter of the single-crystal semiconductor has been increasing recently, the weight that the neck portion has to suffer is obviously increased. Therefore, certain dislocations will appear in a smallest diameter region when the smallest diameter region of the neck portion is close to the shoulder portion. As a result, the dislocations extend to the cylindrical body portion of the growing single-crystal semiconductor and the dislocations appear throughout the single-crystal rod.

SUMMARY OF THE INVENTION

In the view of the above-described problems in the conventional methods, it is an object of the present invention to provide a single-crystal semiconductor pulling apparatus capable of improving the crystallization rate by reinforcing the physical strength of a neck portion of a single-crystal semiconductor without dislocation when the semiconductor grows by means of the Czochralski method.

It is another object of the present invention to provide a single-crystal semiconductor pulling apparatus capable of keeping constant time required by operators regardless of the experiences.

Accordingly, the present invention provides a single-crystal semiconductor pulling apparatus which utilizes the Czochralski method and includes control means for automatically controlling a pulling rate of a seed crystal and a melt temperature, thereby controlling a diameter of a crystal pulled from the seed crystal immersed in the melt. The invention is characterized in that the control means modifies a target value of the diameter of the crystal from a first value which is for ensuring dislocation-free state to a second value which is for retaining the strength of the crystal.

The control means for automatically control is capable of judging the crystal to be in dislocation-free state, that is, measures a length of each potion of the crystal whose diameter is smaller than the first value, and accumulates the length,and judges the crystal to be in dislocation-free state when the accumulated value is a value determined according to a reference length.

In a preferred embodiment of the invention, the first value is about 2–7 mm. The reference length is about 10 to 30 times larger than the first value. The determined value to judge the crystal to be in dislocation-free state is about 20–100% of the reference length. Moreover, the second value is preferably about 1.1–2.0 times larger than the first value. Preferably the target value of the diameter increases from the first value to the second value at a gradient of about 0.02–0.20 mm per 1 mm, as the single-crystal semiconductor is pulled.

Furthermore, the control means modifies automatically the target value of the diameter of the crystal from the first value to the second value when the crystal has been judged to be in dislocation-free state.

The single-crystal semiconductor pulling apparatus of the invention therefore automatically judges the crystal to be in dislocation-free state when the neck portion is grown from the seed, and then automatically modifies the target value of the diameter of the crystal to a larger value for reinforcing the physical strength of the crystal region immediately before the crown step, thereby reducing the probability of dislocation formation in this region. Moreover, the probability that the dislocations appear can also be reduced even though the neck portion is considerably shorter.

DETAILED DESCRIPTION OF THE INVENTION

Figure 1:
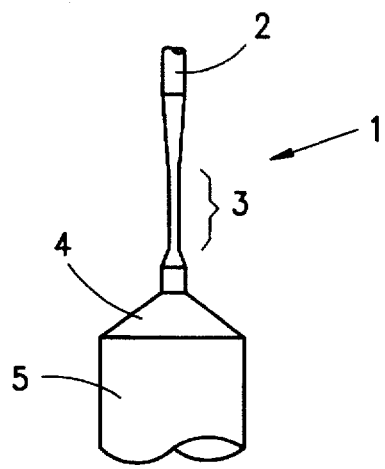
FIG. 1 is a schematic diagram illustrating the region where the dislocations appear in a single-crystal semiconductor.

The embodiment of the invention will be described in accompaniment with the drawings. Referring to FIG. 1, a single-crystal rod 1 includes a neck portion 3 which is grown by immersing a semiconductor seed 2, such as a silicon seed, in a melt. The diameter of the neck portion 3 is automatically reduced to have a slim shape and then expanded to form a shoulder 4 for eliminating dislocation. Therefore, the single-crystal semiconductor rod 1 includes the neck portion 3, the shoulder 4, and a cylindrical body portion 5 which is connected to the shoulder 4. Moreover, the single-crystal semiconductor pulling apparatus includes a control means for automatically controlling a pulling rate of a seed crystal and a melt temperature. The control means modifies a target value of a diameter of a crystal pulled from the seed crystal which is immersed in the melt from a first value to a second value. The first value is for ensuring dislocation-free state, while the second value is for retaining physical strength of the crystal. Furthermore, the control means is provided with the function of judging the crystal to be in dislocation-free state. That is, the control means measures a length of each potion of the crystal whose diameter is smaller than the first value, and accumulates the length, and judges the crystal to be in dislocation-free state when the accumulated value is a value determined according to a reference length.

The invention controls the diameter variation of the neck portion 3 by automatically controlling the pulling rate and melt temperature. The length of each portion of the crystal whose diameter is smaller than the target value is measured and accumulated. When the accumulated length is 20% or larger of a reference length which is about 10–30 times larger than the target diameter, the dislocation-free state is formed at a probability of larger than 90%. This relation is established for a target value within the range of 2–7 mm. Moreover, when the accumulated length reaches 100% of the reference length, dislocation-free state is formed at a probability of about 97%. The pulling rate, although varies according to the controlled diameter, must have a mean value of higher than 2 mm/min for satisfying the aforementioned relation. For example, the crystal can be readily judged to be in dislocation-free state by the calculation of a sequence-control temperature based on the measured diameters and the moved distance of the seed holder.

Figure 4:
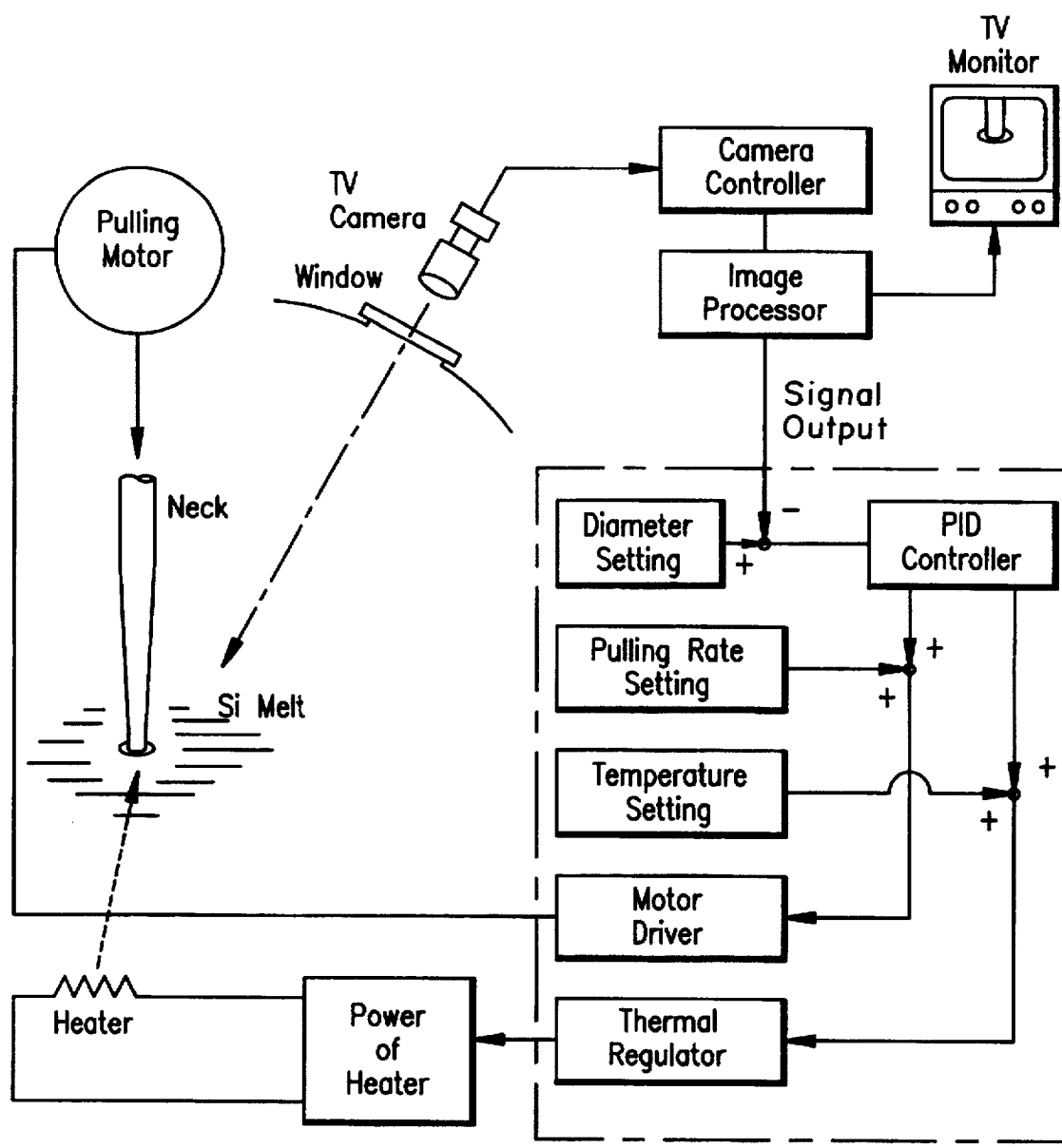
FIG. 4 is a block diagram illustrating the automatic control function of the embodiment of the invention.
Figure 5:
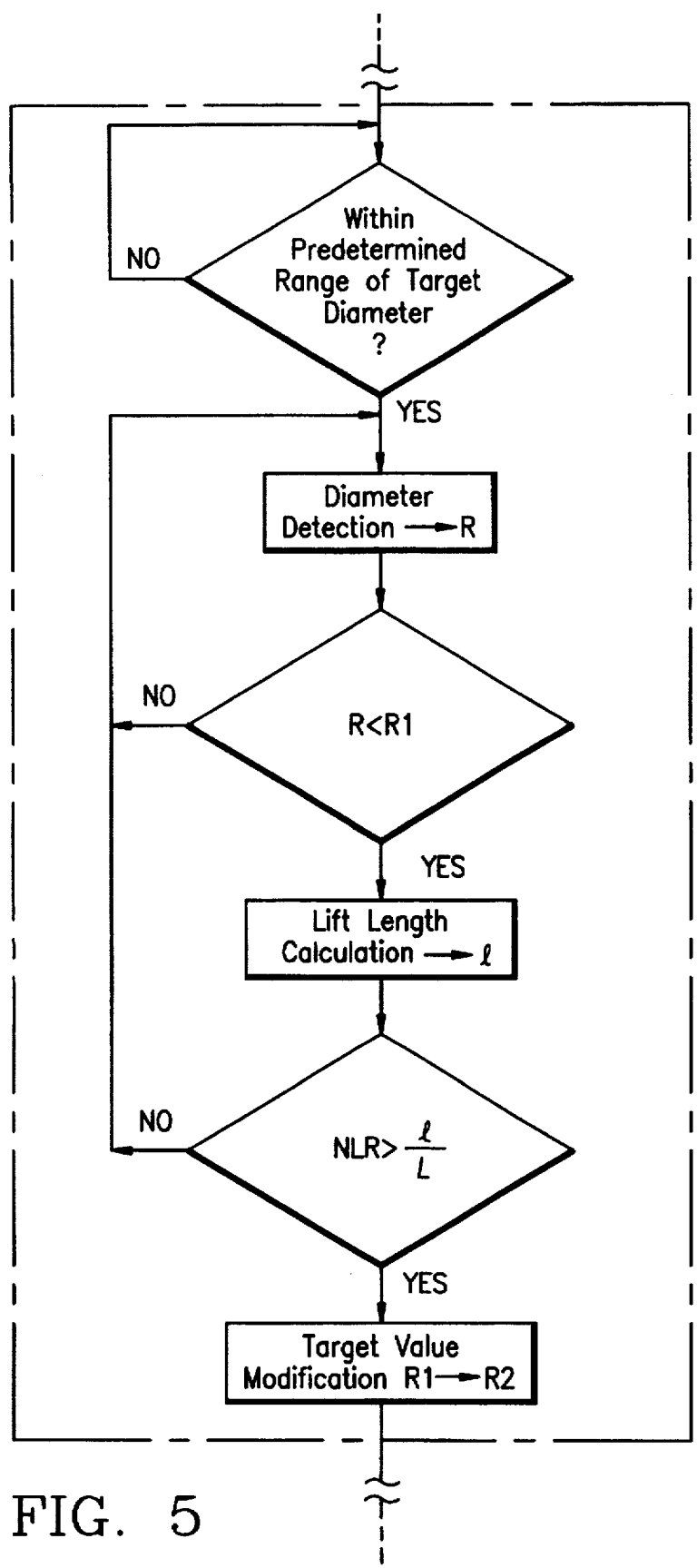
FIG. 5 is a flow chart illustrating the judgment of being dislocation-free state of the embodiment of the invention.

Referring to FIG. 4, the control means includes a camera 35 controller which controls, for example, a CCD TV camera to take pictures through a window provided on top of a main chamber of the single-crystal semiconductor pulling apparatus. The image signals taken from the camera are processed by an image processor and are displayed in a monitor at the same time. Therefore, the growing conditions of the neck portion of the seed crystal which is pulled from the melt by a pulling motor can be observed. The diameter detection output of the image processor is then sent to a PID controller in which the steady-state error of the proportional integrate action is made to zero and a rapid-responding to the proportional and derivative action is performed. At the same time, a predetermined value of the diameter is inputted in the PID controller. The dislocation judgment of the neck portion is then carried out by analyzing the diameter detection value and the target value of the diameter inputted in the PID controller according to the steps of, as shown in FIG. 5. The result of the judgment is taken for automatically controlling a pulling rate setting device and a temperature setting device. Moreover, a pulling rate setting device is automatically controlled by the judgment of the PID controller and outputs a signal to a motor driver to control the device of the pulling motor. In the same manner, temperature setting device is automatically controlled by the judgment of the PID controller and outputs a signal to a thermal regulator to control the power of the heater.

When the crystal has been judged to be in dislocation-free state, the means modifies the target diameter from the first value to the second value automatically. The modification of the target diameter can be carried out step by step or gradually and continuously according to the target value profile of FIG. 2. In order to retain the physical strength and prevent dislocation formation before the crown step, the second value must be about 1.1–2.0 times larger than the first value. Therefore, even though dislocations appear in the neck portion 3, they will not diffuse to the shoulder portion 4 in the crown step. In the conventional method, when dislocations are generated in the shoulder portion 4 during the crown step, it is considered that the neck portion 3 is not completely formed. Therefore, the neck length of the crystal is formed unnecessarily long However, the present invention pulls the seed 2 such that the neck length is about 5–10 times larger than the second value after the crystal is judged to be in dislocation-free state, thereby reducing the total neck length to about one half of that of the conventional crystal.

The operation of the control means will be described according to the flow chart of FIG. 5. The pulling rate and the melt temperature are automatically controlled by presetting target value in the control means, thus growing the crystal with a diameter approaching the target value. According to the dislocation judgment, when the diameter of the crystal reaches the first value R1 referring to FIG. 5, a detection based on the condition NLR>20–100% is carried out. When the NLR value is within a range between 20% and 100%, it is judged that the formation of a region of a neck portion whose diameter keeps the first value is completed. After the completion, the process moves to the second value. In this process, the second value is R2. When the interval of uniform diameter reaches a desired length (0–100 mm) after the appointment of the expected diameter R2, the crown step is carried out.

Figure 2:
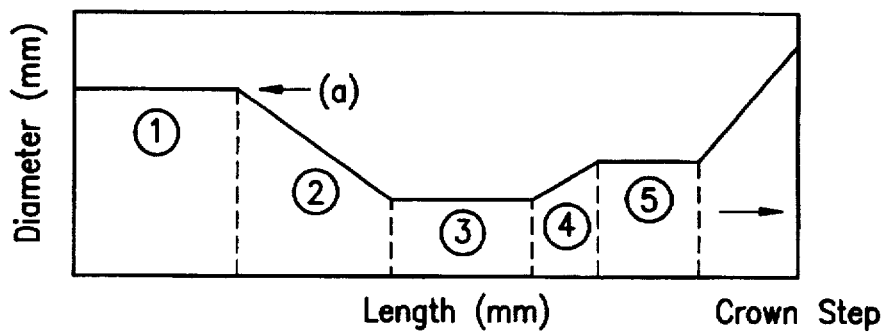
FIG. 2 illustrates the relationship between target diameter and the pulling length of the seed crystal, wherein the horizontal axis represents the length (mm), and the vertical axis is diameter (mm)
Figure 3:
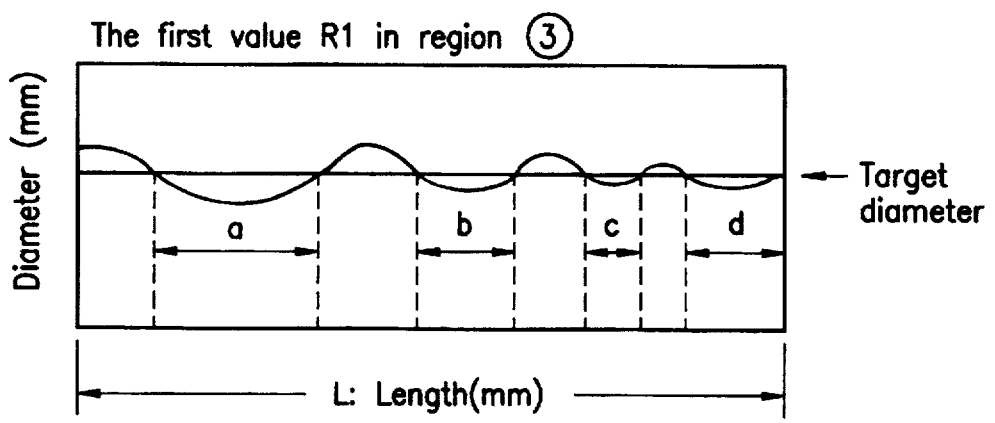
FIG. 3 illustrates the variation of the crystal diameter along the pulling length in the region of the first target diameter of FIG. 2, wherein the horizontal axis represents the length (mm), and the vertical axis is diameter (mm)

Referring to FIG. 2, (a) represents the initial diameter of the solid-melt interface when the seed 2 is immersed in the melt. The value is about 12.5 mm in the embodiment. In region ①, the diameter of the crystal is retained at the initial diameter for a length of about 20 mm. In region ②, a gradient of about 0.08 mm (diameter/length) is retained to reach the first target diameter of about 4 mm. If the control means performs well, the diameter can be controlled within a error range of about ±0.5 mm. In region ③, the diameter is retain at the first value , which has a length of about 50 mm in the embodiment. When the 50 mm pulling length has been reached, the ratio of the accumulated length of the pulled crystal whose diameter is smaller than the first value 4 mm to the reference length is about 32% (refer to formula in FIG. 3).

In the embodiment, the crystal is judged to be in dislocation-free state when the NLR value is 25% or more. Therefore, step moves to the region ④ where the target diameter gradually increases. The target value increases, at a rate of the same as that in region ②, to the second value of about 5.5 mm, and then retains. In region ⑤, when a length of about 35 mm is formed, the neck step is finished and the crown step goes on, thereby forming the cylindrical body portion without dislocation. On experiment was conducted in which 50 examples were repeated according to the embodiment. The probability that dislocations appear in the shoulder 4 is about 3.2%. On the other hand, in the conventional method in which an operator judges the crystal to be in dislocation-free state in the neck portion 3 that is formed with one target diameter, the dislocation is found at a probability of 8.5% in more than 100 pulling. Moreover, the neck length of the conventional seed crystal is about 275 mm, whereas the average neck length of the embodiment, i.e., total length of region ① through region ⑤, is about 182 mm. The length difference reduces a process time to pull crystal of about 40 minutes. Furthermore, the time required to melt the shoulder 4 due to dislocation formation can also be reduced.

In this embodiment, the target value of the diameter increases from the first value to the second value with the gradient of about 0.08 mm per 1 mm. Alternatively, the gradient of the present invention may be within about 0.02–0.20 mm per 1 mm.

Preferably, the control means modifies automatically the target value of the diameter of the crystal from the first value to the second value when the crystal has been judged to be in dislocation-free state.

According to the aforementioned arrangement of dislocation-free single-crystal semiconductor pulling apparatus by means of Czochralski method, the invention therefore improves the crystallization rate by reinforcing the physical strength of the neck portion, and can keep required time constant without being affected the experiences of operators.

What is claimed is:

1. A single-crystal semiconductor pulling apparatus for use in conjunction with the Czochralski method, which comprises:

a control means for automatically controlling a pulling rate of a seed crystal and a temperature of a polycrystal melt and thereby controlling a diameter of a crystal ingot pulled from the seed crystal which is immersed in the melt; the control means automatically controlling the pulling rate and the melt temperature by a two-step control process, so that pulled an ingot from the melt has sufficient strength and dislocation free state, the two-step controlling process including a first step where a diameter of a neck of the pulled ingot is reduced to a first value for ensuring the dislocating fee state, and a second step where the diameter of the neck portion is increased to a second value so as to have the sufficient strength.

2. The apparatus as claimed in claim 1, wherein the control means has a means for measuring a length of each portion of the neck whose diameter is smaller that the first value and for accumulating measured lengths of each neck potion, and a means for judging the ingot to be in a dislocation-free state when the accumulated measured lengths is a value determined according to a reference length.

3. The apparatus as claimed in claim 2, wherein the first value is about 2–7 mm; the reference length is about 10–30 times larger than the first value; and the determined value is about 20–100% of the reference length.

4. The apparatus as claimed in claim 2, wherein the second value is about 1.1–2.0 times larger than the first value.

5. The apparatus as claimed in claim 2, wherein said target diameter increases from the first value to the second value at a gradient of about 0.02–0.20 mm per 1 mm, as the neck portion is pulled.

6. The apparatus as claimed in claim 2, wherein said control means modifies automatically the target value of the diameter of the neck from the first value to the second value when the neck has been judged to be in dislocation-free state.

7. The apparatus as claimed in claim 2, wherein said control means modifies automatically the target value of the diameter of the crystal from the first value to the second value when the crystal has been judged to be in dislocation-free state.

8. A method of pulling a single-crystal semiconductor ingot from a melt by the Czochralski method, which comprises:

forming a neck portion in the ingot by first and second steps, where the first step includes automatically controlling a pulling rate of the ingot for reducing a diameter of the neck portion so as to ensure the ingot is in a dislocation free state, and the second step includes controlling the diameter of the neck portion to a second value so that the ingot has sufficient strength;

forming a shoulder portion of the ingot, and forming a uniform-diameter portion of the ingot.

* * * * *